United States Patent
Blanchard et al.

(10) Patent No.: US 7,375,578 B1
(45) Date of Patent: May 20, 2008

(54) RADIO FREQUENCY ENVELOPE DETECTOR

(75) Inventors: Shane B. Blanchard, Chubbuck, ID (US); Craig L. Christensen, Pocatello, ID (US)

(73) Assignee: ON Semiconductor, Phoenix, AZ (US)

( * ) Notice: Subject to any disclaimer, the term of this patent is extended or adjusted under 35 U.S.C. 154(b) by 293 days.

(21) Appl. No.: 10/977,295

(22) Filed: Oct. 29, 2004

(51) Int. Cl.
*H03K 17/687* (2006.01)

(52) U.S. Cl. .............. 327/427; 455/67.11; 455/127.1; 327/58; 327/61; 327/327; 327/437

(58) Field of Classification Search ............ 455/67.11, 455/127.1; 327/58, 61, 327, 427, 437
See application file for complete search history.

(56) References Cited

U.S. PATENT DOCUMENTS

| | | | | |
|---|---|---|---|---|
| 4,000,472 A | | 12/1976 | Eastland et al. ............. 329/204 |
| 4,250,457 A | * | 2/1981 | Hofmann .................... 329/349 |
| 4,319,196 A | * | 3/1982 | Kwan ......................... 329/352 |
| 4,490,681 A | * | 12/1984 | Turner ........................ 329/352 |
| 4,603,299 A | * | 7/1986 | Monett ........................ 327/58 |
| 4,720,685 A | * | 1/1988 | Garuts ........................ 330/149 |
| 4,866,396 A | * | 9/1989 | Tamura ....................... 329/352 |
| 5,404,113 A | * | 4/1995 | Nitardy ....................... 330/10 |
| 5,481,218 A | * | 1/1996 | Nordholt et al. ............. 327/350 |
| 5,724,002 A | * | 3/1998 | Hulick ........................ 329/361 |
| 6,064,238 A | * | 5/2000 | Wight et al. .................. 327/58 |
| 6,566,915 B1 | | 5/2003 | Krupnik et al. ............... 327/58 |
| 6,573,779 B2 | * | 6/2003 | Sidiropoulos et al. ....... 327/345 |
| 6,590,379 B2 | * | 7/2003 | Mercier ...................... 324/118 |
| 6,600,344 B1 | * | 7/2003 | Newman et al. .............. 327/58 |
| 6,888,409 B1 | * | 5/2005 | Taylor ........................ 330/297 |
| 7,026,797 B2 | * | 4/2006 | McCune, Jr. ............... 323/225 |
| 7,095,256 B1 | * | 8/2006 | Zhak et al. ................... 327/58 |
| 2005/0168282 A1 | * | 8/2005 | Koukkari et al. ........... 330/136 |

* cited by examiner

*Primary Examiner*—Lana Le
*Assistant Examiner*—April S. Guzman
(74) *Attorney, Agent, or Firm*—Workman Nydegger

(57) ABSTRACT

An RF envelope detection circuit that operations at low currents, high sensitivity, and high dynamic range. The circuit receives an AC signal at its input terminal and applies a signal on its output terminal that is a function of the envelope magnitude of the AC signal. To do so, a current source provides a current with an AC signal being superimposed thereon. A rectification circuit rectifies the AC component of this current. A voltage amplifier then amplifies the voltage for providing on the output terminal of the detection circuit. A current sink draws a current from the output terminal that has approximately the same magnitude as the current provided by the current source. A capacitor is coupled to the output terminal of the rectifier so as to store excess charge provided by the rectifier that is in excess of the magnitude of the current provided by the current source.

19 Claims, 3 Drawing Sheets

RADIO FREQUENCY ENVELOPE DETECTOR

BACKGROUND OF THE INVENTION

1. The Field of the Invention

The present invention relates generally to analog circuits. More specifically, the present invention relates to circuits and methods for detecting an envelope in a radio frequency signal.

2. Background and Relevant Art

Access to information is an essential need of mankind. In order to meet this need, information is often conveyed from one location to another. One particularly convenient way to convey information is to electronically transmit a signal representing information. The electronically transmitted signal may then be received by receiver circuitry, which is then capable of interpreting or rendering the information represented by the signal.

Conventional receivers often include a number of analog circuit components, each having a specific purpose. One often-used analog component is called a Radio Frequency (RF) envelope detector. As a radio frequency signal is transmitted, the magnitude of the radio frequency signal RF can vary widely. An RF envelope detector detects the magnitude of the outer bounds of this RF envelope defined by the peak amplitudes in each cycle of oscillation. RF envelope detection is useful, for example, in demodulating an amplitude-modulated signal in which the information is represented by purposefully varying the amplitude of the peaks in the oscillating signal. RF envelope detection is also useful, for example, when detecting signal strength.

Key performance characteristics of an RF envelope detector include current consumption, sensitivity, and dynamic range. Current consumption relates to the amount of current used. Sensitivity is the signal strength of the weakest signal the system can detect with an acceptable signal-to-noise ratio. Dynamic range is the difference between the signal strength of the strongest and weakest signals that the circuit can respond to.

FIG. 3 illustrates a conventional envelope detector 300 in accordance with the prior art. Conventional envelope detection of an RF signal often involves the rectification of the RF signal, followed by low pass filtering the rectified signal. For example, referring to FIG. 3, the signal RF is received at the input terminal 301 and is rectified with rectifying diode 302. The rectified signal is then passed through low pass filter 303 to remove residual RF content. In this case, the low pass filter is simply a resistor 311 and a capacitor 312 coupled in parallel between the output terminal of the rectifying diode 302 and ground. The filtered signal is then provided on the output terminal 304 of the envelope detector 300.

It would be advantageous to reduce current consumption of RF envelope detectors to thereby reduce the power requirements of the RF envelope detector. This would reduce the cost of operating the envelope detector. Furthermore, if the RF envelope detector is operating on battery power, the battery lifetime may be extended.

Furthermore, it would be advantageous to increase sensitivity of the envelope detector so that the envelope detector may operate with very weak signals. It would further be advantageous to increase the dynamic range of the envelope detector.

Accordingly, what would be advantageous is an RF envelope detector that operates at low current, has high sensitivity (also referred to herein as "low signal" sensitivity), and has high dynamic range. It would furthermore be advantageous if the RF envelope detector could be fabricated using conventional CMOS processes, so as to reduce the cost of fabricating the circuitry containing the RF envelope detector.

BRIEF SUMMARY OF THE INVENTION

The foregoing problems with the prior state of the art are overcome by the principles of the present invention, which relate to a Radio Frequency (RF) envelope detection circuit that operates at low currents, high sensitivity, high dynamic range, and that may be fabricated using conventional Complementary Metal Oxide Semiconductor (CMOS) processes.

The envelope detection circuit receives an Alternating Current (AC) signal at its input terminal and applies a signal on its output terminal that is a function of the envelope magnitude of the AC signal. To do so, a current source provides a current. The received AC signal is AC coupled so as to be at least partially superimposed upon the current provided by the current source. This current with the superimposed AC signal is then provided to a rectification circuit, which rectifies the AC signal. A voltage amplifier amplifies the voltage of the signal provided by the rectification circuit, and provides the resulting voltage to the output terminal of the RF envelope detection circuit. A current sink draws a current from the output terminal of the RF envelope detection circuit, where the drawn current has approximately the same magnitude as the current provided by the current source. A capacitor is coupled to the output terminal of the rectifier so as to store excess charge provided by the rectifier that is in excess of the magnitude of the current provided by the current source.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE

PREFERRED EMBODIMENTS

The principles of the present invention relate to a Radio Frequency (RF) envelope detection circuit that operates at low currents, high sensitivity (i.e., low signal sensitivity), high dynamic range, and that may be fabricated using conventional Complementary Metal Oxide Semiconductor (CMOS) processes.

Figure 1:
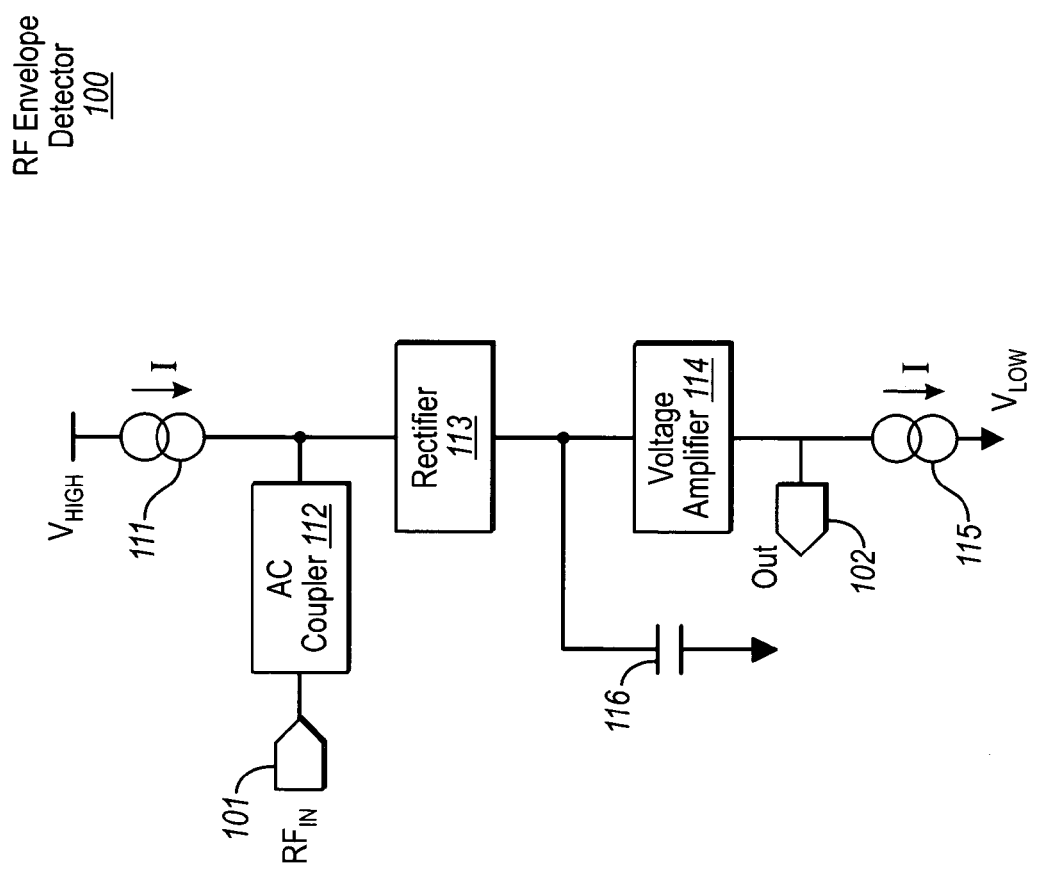
FIG. 1 is a schematic diagram of a Radio Frequency (RF) envelope detection circuit in accordance with the principles of the present invention.

FIG. 1 schematically illustrates an embodiment of an RF envelope detection circuit 100 in accordance with the principles of the present invention. The detection circuit 100 includes an input terminal 101 configured to receive an Alternating Current (AC) signal $RF_{IN}$ during operation. It is this signal that is subjected to RF envelope detection. The detection circuit 100 applies a signal OUT on its output terminal 102 that has a magnitude that is a function of the envelope magnitude of the input signal $RF_{IN}$.

A current source 111 provides a current having a magnitude I during operation. In addition, an AC coupling circuit 112 is coupled to the input terminal 101 of the envelope detection circuit 100 so as to superimpose a portion of the AC signal $RF_{IN}$ onto the current I provided by the current source 111. A rectification circuit 113 has an input terminal configured to receive the current I provided by the current source with the superimposed portion of the AC signal $RF_{IN}$. The rectification circuit 113 then rectifies the superimposed portion of the AC signal onto an output terminal of the rectification circuit 113. A voltage amplifier 114 has its input terminal coupled to the output terminal of the rectification circuit 113, and has an output terminal that is coupled to the output terminal 102 of the RF envelope detection circuit 100. A current sink 115 is coupled to the output terminal 102 of the RF envelope detection circuit and is configured to draw a current from the output terminal of the RF envelope detection circuit. The current I drawn by the current sink 115 is approximately the same magnitude as the current provided by the current source 111. The current magnitude I provided by the current source 111 and drawn by the current sink 115 may be easily optimized so as to improve sensitivity.

During operation, AC current provided through the AC coupler 112 is manifested by a voltage deflection at the output terminal of the rectifier 113. The voltage deflection is low frequency since the portions downstream of the rectifier behave as an RC low pass filter. Specifically, the capacitor 116 behaves as the capacitor in the RC low pass filter, whereas the path through the voltage amplifier 114 and current sink 115 behaves as a resistor in the RC low pass filter. Accordingly, the voltage deflection at the output terminal of the rectification circuit 113 is a function of the envelope magnitude of the AC signal $RF_{IN}$. The voltage deflection at the output terminal of the rectification circuit 113 is passed through a voltage amplifier 114, which amplifies the voltage deflection. Accordingly, the RF envelope detector has high sensitivity thereby being able to detect envelope magnitude for even very small AC signals. The current sink 115 draws off approximately the same amount of current that was provided by the current source 111. Accordingly, RF energy provided through the AC coupler 112 is efficiently preserved as stored charge on the capacitor 116. Thus, the detector 100 performs RF envelope detection for very low currents and power requirements.

Figure 2:
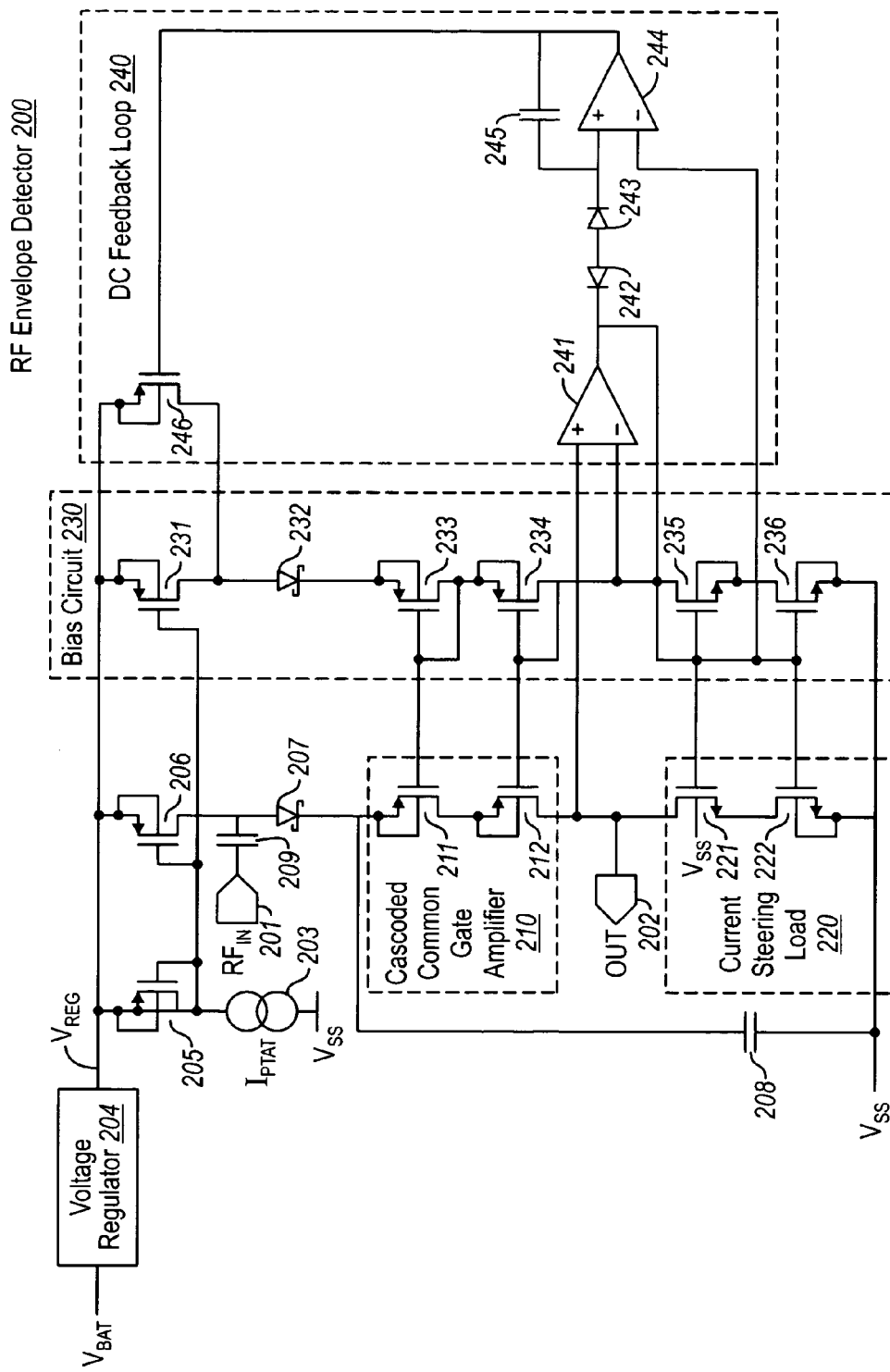
FIG. 2 is a circuit diagram of an example circuit embodiment of the RF envelope detection circuit in accordance with the principles of the present invention.
Figure 3:
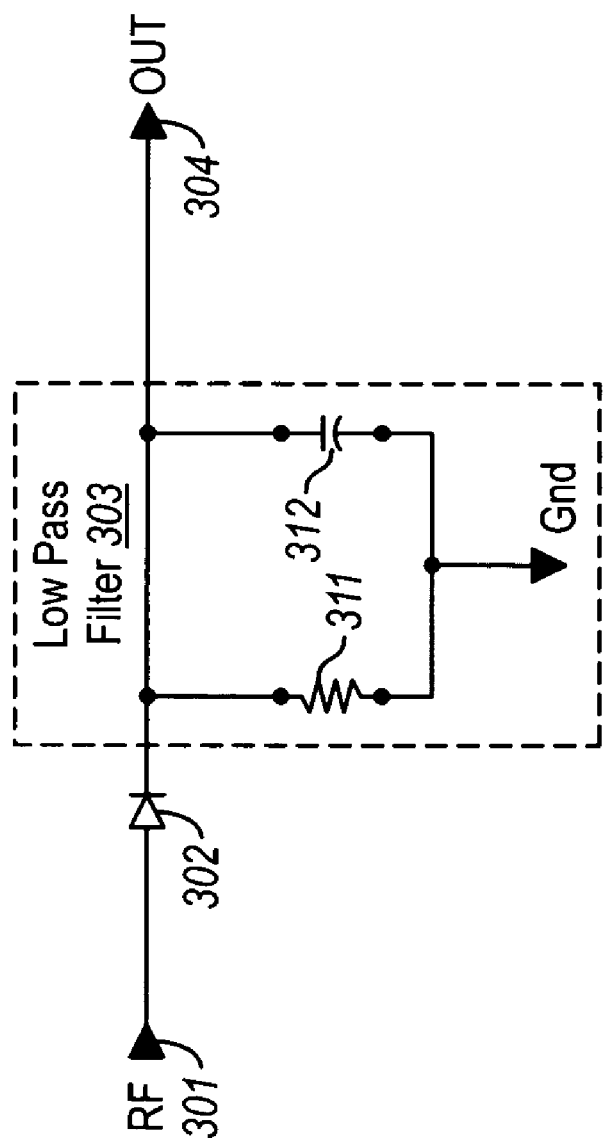
FIG. 3 is a circuit diagram of an RF envelope detection circuit in accordance with the prior art.

FIG. 2 illustrates an example specific circuit embodiment 200 of the RF envelope detector 100 of FIG. 1. The RF envelope detector 200 has superior performance compared to prior art RF envelope detectors. Specifically, current consumption is reduced to 10 μA as compared to conventional envelope detectors, which can draw current of over 500 μA. Furthermore, the sensitivity of the detector 200 is increased to allow the detection of signals as low as −50 dBm. Also, dynamic range is extended to the range of from 45 to 50 dBm. Lastly, all of the illustrated circuit elements may be manufactured using standard CMOS process, thereby preventing the need for additional process steps.

An example of the current source 111 of FIG. 1 is represented in FIG. 2 by the Proportionate To Absolute Temperature (PTAT) current source 203, voltage regulator 204 and p-type field effect transistors 205 and 206. The current source 203 draws a PTAT current $I_{PTAT}$ through the transistor 205. This current is likewise mirrored through transistor 206, which is then provided to diode 207. The PTAT current provides appropriate compensation for temperature dependencies in the operation of field effect transistors. A voltage regulator 204 is coupled to the source terminals of the transistors 205 and 206 so as to provide a stable voltage supply regardless of the fluctuations in any other power supply such as, for example, the battery that provides voltage $V_{BAT}$.

An example of the AC coupling circuit 112 of FIG. 1 is represented in FIG. 2 by the capacitor 209, which capacitively couples the AC signal $RF_{IN}$ to the current provided by the current source. Specifically, one terminal of the capacitor 209 is coupled to the input terminal 201 of the detector circuit 200, while the other terminal of the capacitor 209 is coupled to the drain terminal of the p-type field effect transistor 206.

An example of the rectification circuit 113 of FIG. 1 is represented in FIG. 2 by a diode 207. In the illustrated case, the diode 207 is a Schottky diode. The anode terminal of the diode 207 is coupled to the drain terminal of the p-type field effect transistor 206. The cathode terminal of the diode 207 provides a voltage deflection that is a function of the envelope magnitude of the AC signal $RF_{IN}$. The voltage deflection at the cathode terminal of the diode 207 is low frequency due to an RC low pass filter being positioned downstream from the diode 207. Specifically, the capacitor 208 represents the capacitive component of the RC low pass filter. The downstream path represented by cascoded common gate amplifier 210 and current steering load 220 represents the resistive portion of the RC low pass filter.

An example of the voltage amplifier 114 of FIG. 1 is represented in FIG. 2 by cascoded common gate amplifier 210, which includes two p-type field effect transistors 211 and 212 operating in the saturation region with channel regions coupled in series between the diode 207 and the output terminal 202. The common gate amplifier 210 is illustrated as being cascoded, which results in greater gain than would an uncascoded common gate amplifier. This increased gain provides further increased sensitivity since now even minute AC signals may generate sufficient voltage deflection to be useful at output terminal 202. However, the voltage amplifier may alternatively be a common gate amplifier which is not cascoded, although this may result in slightly less sensitivity.

The use of a common gate amplifier as the voltage amplifier provides for increased dynamic range. Specifically, the gain of the common gate amplifier 210 is maximized when the envelope magnitude is low. However, when as the envelope magnitude increases, the gain of the common gate amplifier 210 actually decreases. This means that the output voltage at the output terminal 202 may be a function of the envelope magnitude for greater ranges of envelope magnitudes, thereby extending dynamic range.

An example of the current sink 115 of FIG. 1 is the current steering load 220. The current steering load 220 includes two n-type field effect transistors 221 and 222 having their gate terminals biased so as to operate in the saturation region, and having their channel regions coupled in series between the output terminal 202 and $V_{SS}$.

A bias circuit 230 is provided to ensure that the transistors 211, 212, 221 and 222 operate in the saturation region. The bias circuit includes a current path from the high voltage source carrying voltage $V_{REG}$ through the channel region of p-type field effect transistor 231, through the Schottky diode 232, through the p-type field effect transistors 233 and 234, through n-type field effect transistors 235 and 236 and to the low voltage supply $V_{SS}$. The transistor 231 is current mirrored to also supply current $I_{PTAT}$. The transistors 233, 234, 235 and 236 are current mirrored with transistors 211, 212, 221 and 222, respectively.

As previously mentioned, the current steering load 220 should draw as much current from the output terminal 202 as is provided by the current source. Otherwise, the capacitor 208 would not maintain a voltage deflection that is a function of the envelope magnitude. Instead, the capacitor would either be completely charged or discharged, depending on whether the current drawn is less or more, respectfully, than the current provided by the current source. In order to maintain this condition, a DC feedback loop 240 is provided between the current steering load 220 and the bias circuit 230.

Specifically, the DC feedback loop 240 includes two operational amplifier 241 and 244, two rectifiers 242 and 243, capacitor 245 and p-type field effect transistor 246. The positive input terminal of the operation amplifier 241 is coupled to the output terminal 202, with the output terminal of the operational amplifier 241 coupled to its own negative input terminal and to the drain terminals of transistors 234 and 235 and to the cathode terminal of diode 242. The diode 242 also has an anode terminal coupled back-to-back with the anode terminal of the diode 243. The cathode terminal of the diode 243 is coupled to the positive input terminal of the operation amplifier 244. The negative input terminal of the operational amplifier 244 is coupled to the drain terminals of the transistors 234 and 235. The operational amplifier 244 is configured in an integrating configuration with the capacitor 245 disposed in a positive feedback path of the operational amplifier 244. The leakage of diodes 242 and 243 provide an extremely high resistance that with capacitor 245 form a very long integration time. The gate terminal of the transistors 246 is coupled to the output terminal of the operational amplifier 244. The source terminal of the transistor 246 is coupled to the high voltage source $V_{REG}$, while the drain terminal of the transistor 246 is coupled to the drain terminal of the transistor 231. In this configuration, the current drawn by the current steering load 220 is kept approximately the same as the current provided by the drain of transistor 206.

Accordingly, an RF envelope detection circuit has been described that has low current requirements, high sensitivity (i.e., low signal sensitivity), and increased dynamic range. Furthermore, each of the circuit elements shown in FIG. 2 may be fabricated using conventional CMOS processes, thereby simplifying the fabrication process.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. A radio frequency RF envelope detection circuit comprising the following:
    an input terminal configured to receive an Alternating Current (AC) signal during operation;
    an output terminal;
    a first current source or sink configured to provide or draw a current during operation;
    an AC coupling circuit coupled to the input terminal of the RF envelope detection circuit so as to superimpose a portion of the AC signal received at the input terminal onto the current provided or drawn by the first current source or sink during operation;
    a rectification circuit having an input terminal configured to receive or provide at least a portion of the current provided or drawn by the first current source or sink with the superimposed portion of the AC signal, the rectification circuit configured to rectify the received or provided current onto an output terminal of the rectification circuit;
    a voltage amplifier having an input terminal coupled to the output terminal of the rectification circuit, and having an output terminal that is coupled to the output terminal of the RF envelope detection circuit;
    a second current source or sink coupled to the output terminal of the RF envelope detection circuit and configured to draw or provide a current from the output terminal of the RF envelope detection circuit, the current provided or drawn by the second current source or sink being of approximately the same magnitude as the current provided or drawn by the first current source or sink, wherein if the first current source or sink acts as a current source to provided current, the second current source or sink acts a current sink to draw current, and wherein if the first current source or sink acts a current sink to draw current, the second current source or sink acts as a current source to provide current; and
    a capacitor coupled to the output terminal of the rectifier so as to store excess charge provided by the rectifier that is in excess of the magnitude of the current provided by the current source.

2. An RF envelope detection circuit in accordance with claim 1, wherein the magnitude of the current provided or drawn by the current source or sink is approximately proportionate to absolute temperature.

3. An RF envelope detection circuit in accordance with claim 2, wherein the AC coupling circuit comprises a capacitor having a first and second terminal, wherein the first terminal is coupled to the input terminal of the RF envelope detection circuit, and the second terminal is coupled to the input terminal of the rectification circuit.

4. An RF envelope detection circuit in accordance with claim 3, wherein the rectification circuit comprises a diode having an anode terminal and a cathode terminal, wherein the anode terminal is the input terminal of the rectification circuit, and the cathode terminal is the output terminal of the rectification circuit.

5. An RF envelope detection circuit in accordance with claim 4, wherein the diode is a Schottky diode.

6. An RF envelope detection circuit in accordance with claim 1, wherein the AC coupling circuit comprises a capacitor having a first and second terminal, wherein the first terminal is coupled to the input terminal of the RF envelope detection circuit, and the second terminal is coupled to the input terminal of the rectification circuit.

7. An RF envelope detection circuit in accordance with claim 6, wherein the rectification circuit comprises a diode having an anode terminal and a cathode terminal, wherein the anode terminal is the input terminal of the rectification circuit, and the cathode terminal is the output terminal of the rectification circuit.

8. An RF envelope detection circuit in accordance with claim 7, wherein the diode is a Schottky diode.

9. An RF envelope detection circuit in accordance with claim 1, wherein the rectification circuit comprises a diode having an anode terminal and a cathode terminal, wherein the anode terminal is the input terminal of the rectification circuit, and the cathode terminal is the output terminal of the rectification circuit.

10. An RF envelope detection circuit in accordance with claim 9, wherein the diode is a Schottky diode.

11. An RF envelope detection circuit in accordance with claim 1, wherein the voltage amplifier is a common gate amplifier.

12. An RF envelope detection circuit in accordance with claim 11, wherein the common gate amplifier is a cascoded common gate amplifier comprising a plurality of field effect transistors.

13. An RF envelope detection circuit in accordance with claim 12, further comprising the following:
   a bias circuit coupled to the gate terminal of the plurality of field effect transistors so as to bias the plurality of field effect transistors in the saturation region.

14. An RF envelope detection circuit in accordance with claim 13, wherein the plurality of field effect transistors is a first plurality of field effect transistors, wherein the first current source or sink is a current steering load comprising a second plurality of field effect transistors.

15. An RF envelope detection circuit in accordance with claim 14, further comprising the following:
   a bias circuit coupled to the gate terminals of the first and second plurality of field effect transistors so as to bias the first and second plurality of field effect transistors in the saturation region.

16. An RF envelope detection circuit in accordance with claim 15, further comprising the following:
   a Direct Current (DC) feedback loop coupled between the gate terminals of the first plurality of field effect transistors and the bias circuit.

17. An RF envelope detection circuit in accordance with claim 1, wherein the second current source or sink is a current steering load comprising a plurality of field effect transistors.

18. An RF envelope detection circuit in accordance with claim 17, further comprising the following:
   a bias circuit coupled to the gate terminal of the plurality of field effect transistors so as to bias the plurality of field effect transistors in the saturation region.

19. An RF envelope detection circuit in accordance with claim 18, further comprising the following:
   a Direct Current (DC) feedback loop coupled between the gate terminals of the plurality of field effect transistors and the bias circuit.

* * * * *